US011139233B2

(12) United States Patent
Tan et al.

(10) Patent No.: US 11,139,233 B2
(45) Date of Patent: Oct. 5, 2021

(54) CAVITY WALL STRUCTURE FOR SEMICONDUCTOR PACKAGING

(71) Applicant: UTAC Headquarters Pte. Ltd., Singapore (SG)

(72) Inventors: Hua Hong Tan, Singapore (SG); Wilson Poh Leng Ong, Singapore (SG); Kriangsak Sae Le, Bangkok (TH); Saravuth Sirinorakul, Bangkok (TH); Somsak Phukronghin, Bangkok (TH); Paweena Phatto, Bangkok (TH)

(73) Assignee: UTAC Headquarters Pte. Ltd., Singapore (SG)

( * ) Notice: Subject to any disclaimer, the term of this patent is extended or adjusted under 35 U.S.C. 154(b) by 0 days.

(21) Appl. No.: 16/886,728

(22) Filed: May 28, 2020

(65) Prior Publication Data

US 2020/0321273 A1    Oct. 8, 2020

Related U.S. Application Data

(62) Division of application No. 16/056,541, filed on Aug. 7, 2018, now Pat. No. 10,707,161.

(Continued)

(51) Int. Cl.
*H01L 23/498* (2006.01)
*H01L 23/16* (2006.01)
(Continued)

(52) U.S. Cl.
CPC .... *H01L 23/49838* (2013.01); *H01L 21/4807* (2013.01); *H01L 21/4857* (2013.01); *H01L 21/52* (2013.01); *H01L 21/56* (2013.01); *H01L 23/04* (2013.01); *H01L 23/055* (2013.01); *H01L 23/16* (2013.01); *H01L 23/24* (2013.01); *H01L 23/3121* (2013.01); *H01L 23/49822* (2013.01); *H01L 24/45* (2013.01); *H01L 24/48* (2013.01); *H01L 24/85* (2013.01); *H01L 2224/45124* (2013.01); *H01L 2224/45139* (2013.01);
(Continued)

(58) Field of Classification Search
CPC ..... H01L 23/49838; H01L 2924/01079; H01L 2924/14; H01L 21/4807; H01L 21/4857; H01L 21/52; H01L 23/055
USPC ......... 438/106, 125; 257/680, 667, 687, 704
See application file for complete search history.

(56) References Cited

U.S. PATENT DOCUMENTS

| | | |
|---|---|---|
| 2005/0161755 A1 | 7/2005 | Huang et al. |
| 2013/0056863 A1 | 3/2013 | Chi et al. |
| 2016/0118427 A1* | 4/2016 | Hsu et al. ......... H01L 27/14618 257/434 |

* cited by examiner

*Primary Examiner* — Thinh T Nguyen
(74) *Attorney, Agent, or Firm* — Horizon IP PTE Ltd

(57) ABSTRACT

A method for forming a semiconductor package is disclosed herein. The method includes forming a package substrate having a first major surface and a second major surface opposite to the first major surface. The package substrate includes a recess region below the first major surface defined with a die region and a non-die region surrounding the die region. A semiconductor die is disposed in the die region within the recess region. A dam structure is disposed within the recess region. The dam structure surrounds the semiconductor die and extends upwardly to a height below the first major surface of the package substrate. The method also includes dispensing a liquid encapsulant material into the recess region. The liquid encapsulant material is surrounded by the dam structure and extends upwardly to a height below the height of the dam structure. A package lid is attached to the package substrate.

20 Claims, 16 Drawing Sheets

Related U.S. Application Data

(60) Provisional application No. 62/542,282, filed on Aug. 7, 2017.

(51) Int. Cl.
*H01L 21/48* (2006.01)
*H01L 23/31* (2006.01)
*H01L 21/52* (2006.01)
*H01L 21/56* (2006.01)
*H01L 23/055* (2006.01)
*H01L 23/04* (2006.01)
*H01L 23/24* (2006.01)
*H01L 23/00* (2006.01)

(52) U.S. Cl.
CPC ............ *H01L 2224/45144* (2013.01); *H01L 2224/45147* (2013.01); *H01L 2224/45155* (2013.01); *H01L 2224/48091* (2013.01); *H01L 2224/48227* (2013.01); *H01L 2924/10161* (2013.01); *H01L 2924/15174* (2013.01); *H01L 2924/15786* (2013.01); *H01L 2924/16151* (2013.01); *H01L 2924/16195* (2013.01); *H01L 2924/181* (2013.01)

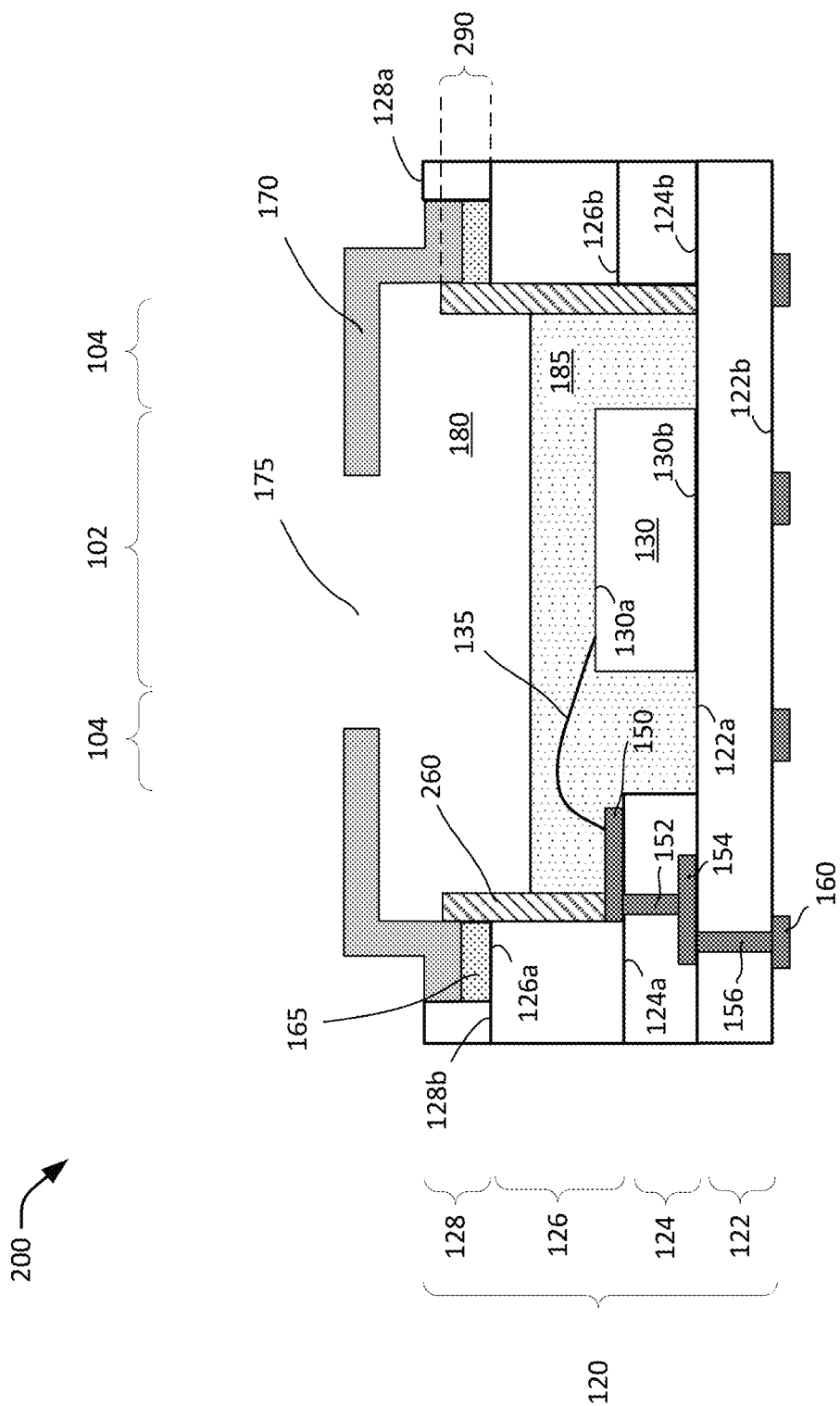

CAVITY WALL STRUCTURE FOR SEMICONDUCTOR PACKAGING

CROSS-REFERENCE TO RELATED APPLICATIONS

This application is a divisional application which claims the benefit of co-pending U.S. patent application Ser. No. 16/056,541, filed on Aug. 7, 2018, which claims the benefit of U.S. Provisional Application Ser. No. 62/542,282 entitled "Cavity Wall Structure For Semiconductor Packaging" filed on Aug. 7, 2017. This application further cross-references to U.S. patent application Ser. No. 15/788,753, filed on Oct. 19, 2017. All disclosures are herein incorporated by reference in their entireties for all purposes.

FIELD OF THE INVENTION

The present invention generally relates to a semiconductor package. More specifically, the present invention is directed to an improved semiconductor packaging structure that increases package reliability, lowers production cost and results in higher yield.

BACKGROUND

Ceramic semiconductor packages are typically fabricated with a cavity defined by sidewalls of a ceramic substrate. A semiconductor die is housed within the cavity and is electrically connected to the interconnect structures of the ceramic semiconductor package. A lid structure is positioned over the semiconductor chip and attached to an upper surface of the ceramic substrate to enclose the semiconductor chip within the cavity.

Conventional methods of forming such ceramic substrate packages may result in poor adhesion of the lid structure to the surface of the ceramic substrate, which reduces reliability and yield of the ceramic semiconductor package.

From the foregoing discussion, it is desirable to provide a ceramic semiconductor package with improved reliability and a cost-efficient method of forming such a semiconductor package.

SUMMARY

Embodiments generally relate to a method for forming the semiconductor package. The method includes forming a multi-layer package substrate having a first major surface and a second major surface opposite to the first major surface. The package substrate includes a recess region extending downwardly from the first major surface of the package substrate. The recess region is defined with a die region and a non-die region surrounding the die region. A semiconductor die is disposed in the die region within the recess region. The method also includes forming wire bonds which electrically connect the semiconductor die to input/output (I/O) terminals disposed adjacent the second major surface of the package substrate. A dam structure is formed within the recess region. The dam structure surrounds the semiconductor die and extends upwardly to a height below the first major surface of the package substrate. A liquid encapsulant material is dispensed into the recess region. The liquid encapsulant material is surrounded by the dam structure. The liquid encapsulant extends upwardly to a height below the height of the dam structure. A package lid is attached to the package substrate.

In another embodiment, a method of forming a semiconductor package includes forming a package substrate having a first major surface and a second major surface opposite to the first major surface. The package substrate includes a recess region extending downwardly from the first major surface of the substrate. The recess region is defined with a die region and a non-die region surrounding the die region. A semiconductor die is disposed in the die region within the recess region. A dam structure is formed within the recess region and surrounds the semiconductor die and extends upwardly to a height below the first major surface of the package substrate. A liquid encapsulant material is dispensed into the recess region. The liquid encapsulant material is surrounded by the dam structure and extends upwardly to a height below the height of the dam structure. A package lid is attached to the package substrate and encloses the recess region.

In yet another embodiment, a method for forming the semiconductor package is disclosed. The method includes forming a package substrate having a first major surface and a second major surface opposite to the first major surface. The package substrate includes a recess region below the first major surface defined with a die region and a non-die region surrounding the die region. A semiconductor die is disposed in the die region within the recess region. A dam structure is disposed within the recess region. The dam structure surrounds the semiconductor die and extends upwardly to a height below the first major surface of the package substrate. The method also includes dispensing a liquid encapsulant material into the recess region. The liquid encapsulant material is surrounded by the dam structure and extends upwardly to a height below the height of the dam structure. A package lid is attached to the package substrate.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of various embodiments. In the following description, various embodiments of the present disclosure are described with reference to the following, in which:

FIG. 2 shows a cross-sectional view of another embodiment of a semiconductor package;

DETAILED DESCRIPTION

Embodiments generally relate to semiconductor packages and methods for forming semiconductor packages. The semiconductor package is used to package one or more semiconductor dies or chips having an integrated circuit (IC). For the case of more than one semiconductor die, the semiconductor dies may be arranged in a planar arrangement, vertical arrangement, or a combination thereof. The semiconductor dies, for example, may include memory devices, logic devices such as mixed signal logic devices, communication devices, radio frequency (RF) devices, optoelectronic devices, digital signal processors (DSPs), microcontrollers, system-on-chips (SOCs), micro-electromechanical (MEM) chips, as well as other types of devices or a combination thereof. Such packages may be incorporated into electronic products or equipment, such as phones, computers as well as mobile and mobile smart products. Incorporating the packages into other types of products may also be useful.

Figure 1A:
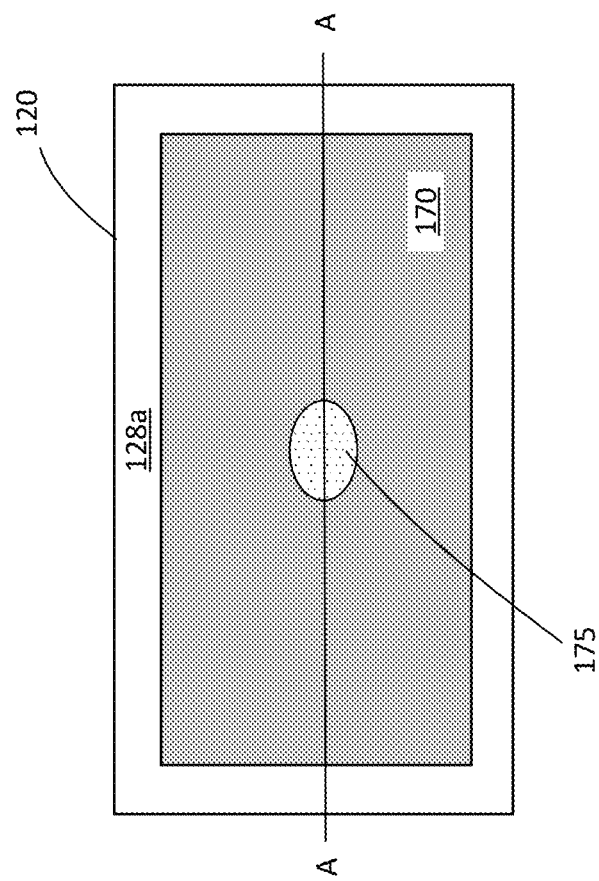
FIGS. 1a-1b show various top views of an embodiment of a semiconductor package.
Figure 1B:
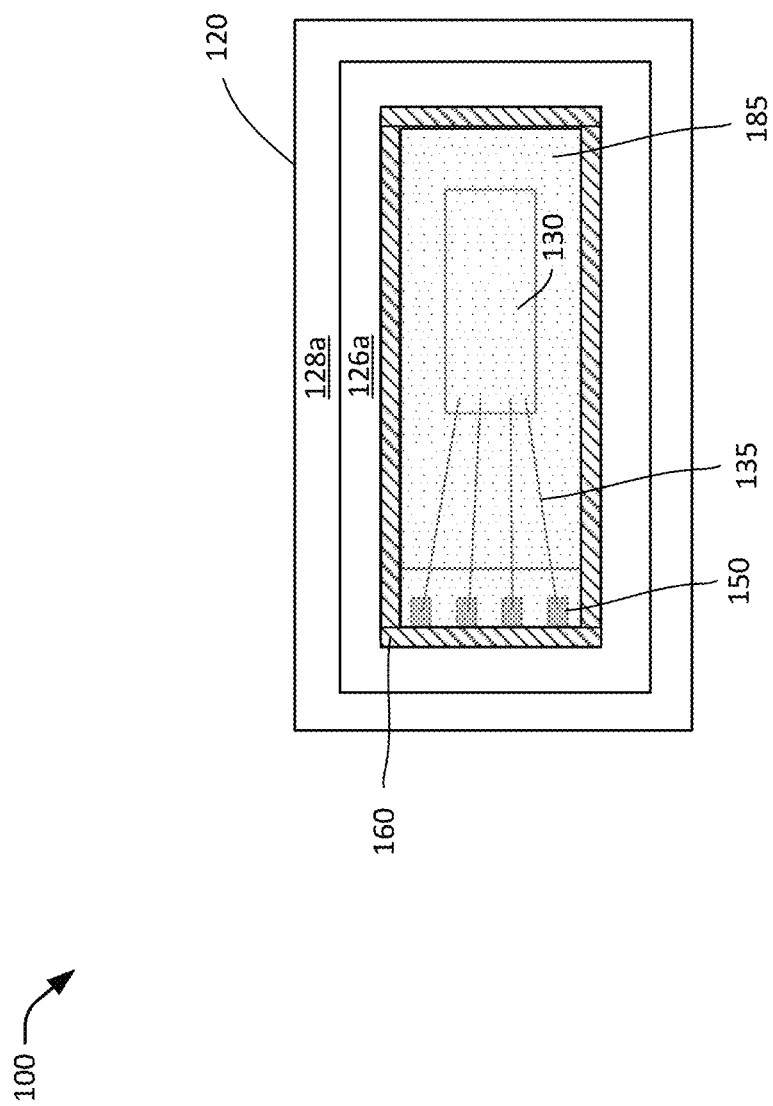
Figure 1C:
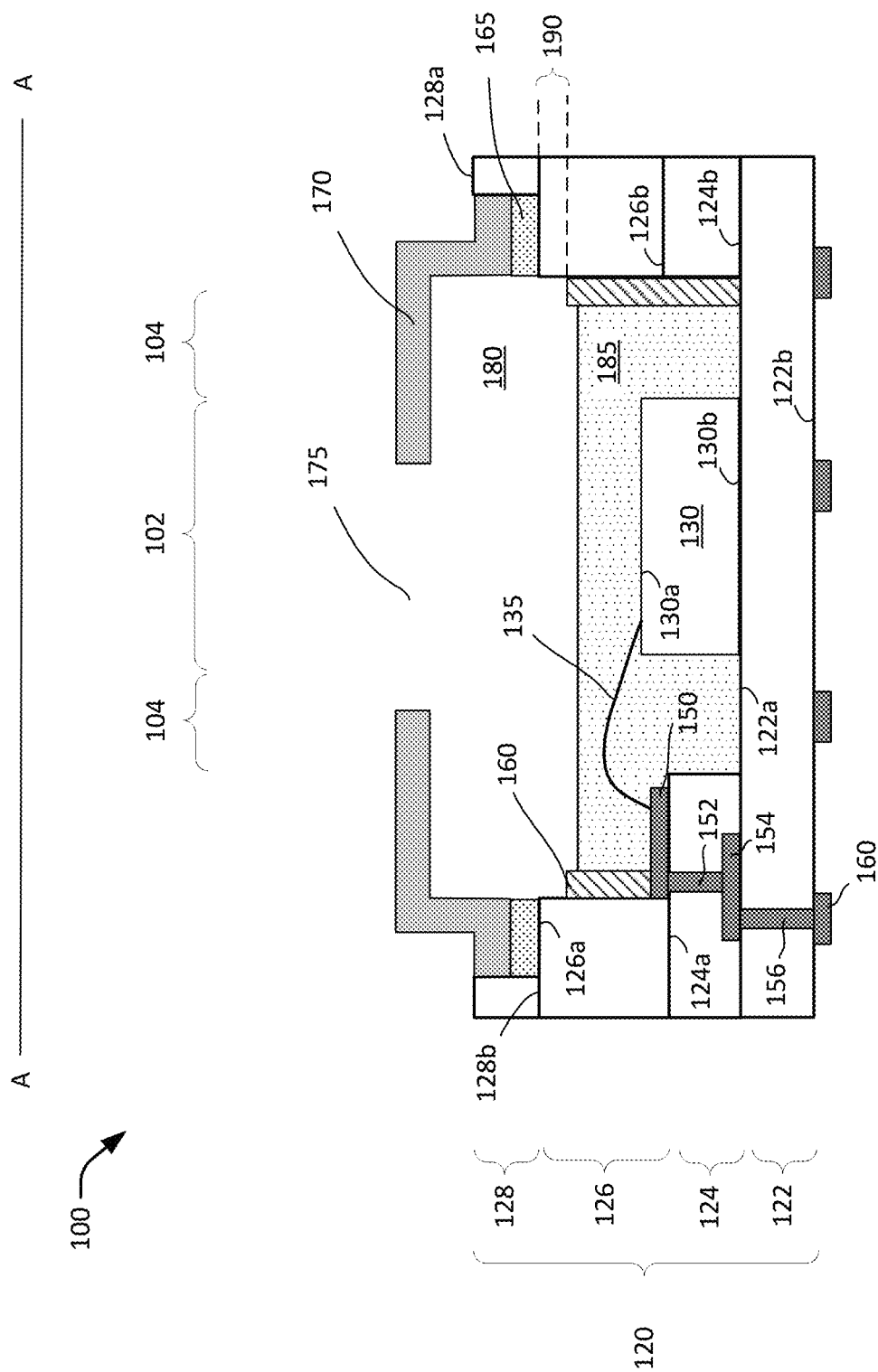
FIG. 1c shows a cross-sectional view of the semiconductor package of FIG. 1a taken along the A-A plane.

FIGS. 1a-1c show various views of an embodiment of a semiconductor package 100 in accordance with the present invention. In particular, FIG. 1a shows a top view of a semiconductor package 100 having a package lid 170, FIG. 1b shows a simplified plan view of the semiconductor package 100 of FIG. 1a with the package lid removed, and FIG. 1c shows a cross-sectional view of the semiconductor package 100 of FIG. 1a taken along the A-A plane.

The semiconductor package 100 includes a package substrate 120. In one embodiment, the package substrate 120 may include a plurality of dielectric substrate layers that may be laminated or built-up. For example, the package substrate 120 includes a bottom substrate layer 122, a first intermediate substrate layer 124 disposed on the bottom substrate layer 122, a second intermediate substrate layer 126 disposed on the first intermediate substrate layer 124, and a top substrate layer 128 disposed on the second intermediate substrate layer 128. Other configurations of a multi-layer package substrate 120 may also be useful. In one embodiment, the package substrate 120 is a laminate-based multi-layer ceramic substrate. For example, the package substrate 120 includes first and second intermediate ceramic substrate layers 124 and 126 sandwiched between top and bottom ceramic substrate layers 128 and 122. Other types of dielectric substrate layer may also be used to form the package substrate 120. Each of the package substrate layers includes a first major surface (e.g., 122a, 124a, 126a, 128a) and a second major surface (e.g., 122b, 124b, 126b, 128b) opposite to the first major surface. The first major surface of the substrate layers may be referred to as the top planar surface and the second major surface of the substrate layers may be referred to as the bottom planar surface. Other designations for the first and second major surfaces may also be useful.

Although four package substrate layers are shown in FIG. 1c, it is understood that the package substrate 120 may be configured to include other number of substrate layers, depending on design requirements.

The package substrate 120 includes a plurality of interconnect structures that electrically connect the semiconductor die 130 to input/output (I/O) terminals 160 of the package substrate 120 located on the bottom planar surface 122b of the bottom substrate layer 122. The I/O terminals 160 are, for example, configured as terminal pads corresponding to metal lands. The I/O terminals 160 of the semiconductor package 100 may be arranged to provide a ball grid array (BGA) or land grid array (LGA) semiconductor package. Other shapes or arrangements of I/O terminals 160 may also be employed, depending on design requirements. For example, the I/O terminals 160 may also be configured to include metal balls (e.g., solder balls) or spherical-shaped bumps formed on the metal lands.

The interconnect structures may include a plurality of bond pads 150, conductive traces 154 and via contacts 152 and 156. In one embodiment, bond pads 150 and conductive traces 154 are formed on the top surfaces of the substrate layers. For example, bond pads 150 are disposed on the exposed top planar surface 124a of the first intermediate substrate layer 124 while the conductive traces 154 are disposed on the top planar surface 122a of the bottom substrate layer 122. The bond pads 150 on the first intermediate substrate layer 124 may define a first line level; the conductive traces 154 on the top planar surface 122a of the bottom substrate layer 122 may define a second line level; and the terminal pads 160 on the bottom planar surface 122b of the bottom substrate layer 122 may define a third line level.

In one embodiment, a plurality of via contacts (e.g., 152 and 156) are disposed in the package substrate 120 to form an electrical interconnection between the different line levels 120. For example, via contacts 152 in the first intermediate substrate layer 124 extend from the top planar surface 124a to the bottom planar surface 124b to electrically connect bond pads 150 in the first line level to conductive traces 154 in the second line level; and via contacts 156 in the bottom substrate layer 122 extend from the top planar surface 122a to the bottom planar surface 122b to electrically connect conductive traces 154 in the second line level to terminal pads 160. Via contacts 152 in the first intermediate substrate layer 124 may define a first via level and via contacts 156 in the bottom substrate layer 122 may define a second via level.

Although the bond pads 150 are illustrated as extending to a side wall of the recess region (e.g., the inner sidewall of the second intermediate substrate layer 126), it is understood that the bond pads 150 may be configured to be spaced away from the sidewall of the recess region. Although only bond pads 150 are illustrated in the first line level, it is understood that the first line level may also be configured to include one or more conductive traces. For example, conductive traces may be disposed in the first line level to electrically connect the bond pads 150 to via contacts 152 in the first via level. Other configurations of interconnect structures may also be useful, depending on design requirements. The interconnect structures can also include any number of bond pads 150, conductive traces 154, via contacts 152 and 156, and I/O terminals 160 as required. Generally, conductive traces are configured with reduced thickness and pitch relative to bond pads to facilitate routing of electrical signals between interconnect structures.

A recess region is disposed in the package substrate 120. The recess region exposes a portion of the top planar surface 122a of the bottom substrate layer 122 and a portion of the top planar surfaces 124a and 126a of the first and second intermediate substrate layers 124 and 126. In one embodiment, the recess region includes a first bottom surface defined by the exposed portion of the top planar surface 122a of the bottom substrate layer 122, and a second bottom surface defined by the exposed portion of the top planar surface 124a of the first intermediate substrate layer 124. The first and second bottom surfaces of the recess region may be non-coplanar surfaces. For example, the first bottom surface of the recess region is a step lower relative to the second bottom surface. The step height between the first and second bottom surfaces is, for example, defined by the thickness of the first intermediate substrate layer 124. In one embodiment, the exposed portion of the top planar surface 126a of the second intermediate substrate layer 126 corresponds to a lid-attach region of the package substrate 120. For example, a package lid 170 is mounted onto the lid-attach region, as will be described in more detail below. The sidewalls of the recess region are defined by inner sidewalls of the top substrate layer 128 and inner sidewalls of the first and second intermediate substrate layers 124 and 126.

In one embodiment, the recess region is defined with a die region 102 and a non-die region 104 surrounding the die region 102. The die region 102 is, for example, concentrically positioned within the periphery of the first bottom surface. Other configurations of the die and non-die regions may also be useful. As shown, a semiconductor die or chip 130 is mounted onto the first bottom surface of the recess region in the die region 102. The semiconductor die 130 includes a first major surface 130a and a second major surface 130b opposite to the first major surface. The first major surface 130a may be referred to as the top surface and the second major surface 130b may be referred to as the bottom surface. Other designations for the first and second major surfaces may also be useful.

The top surface 130a of the semiconductor die 130 includes openings in a final passivation layer to expose conductive die pads (not shown). The die pads serve as contact terminals for electrical connections to the internal circuitry of the semiconductor die 130. The die pads are, for example, formed of a conductive material, such as copper (Cu), aluminum (Al), Gold (Au), Silver (Ag), Nickel (Ni), solder material, or the alloys of these materials, or a combination thereof. Other types of conductive material may also be useful. The die pads may be arranged into one or more rows disposed along the periphery of the top surface 130a. Other arrangements of die pads may also be useful.

In one embodiment, the bottom surface 130b of the semiconductor die 130 is mounted onto the die region of the first bottom surface of the recess region using a die attach layer (not shown). The die attach layer is, for example, an adhesive layer. Various adhesive material may be used to form the die attach layer. For example, the die attach layer may be a polymer material, including epoxy resin paste, polyimide tape, or the like. Other types of adhesive material, including solder material, may also be used to form the die attach layer. The die attach layer directly attaches the bottom surface 130b of the semiconductor die 130 to the bottom substrate layer 122.

In one embodiment, a plurality of wire bonds 135 are provided to electrically connect the die pads on the top surface 130a of the semiconductor die 130 to the bond pads 150 on the second bottom surface of the recess region. The wire bonds 135, for example, may be formed of any suitable metal material such as, but not limited to, Cu, Au, Ag, Al, or the alloys of these materials, or a combination thereof. Other types of conductive material may also be used. The wire bonds 135 create electrical connection between the interconnect structures (e.g., bond pads, conductive traces, via contacts, terminal pads) of the package substrate 120 and the semiconductor die 130.

In one embodiment, a dam structure 160 is disposed within the recess region. The dam structure 160, for example, substantially surrounds the semiconductor die 130 and wire bonds 135, as shown particularly in FIG. 1b. The dam structure 160 extends along the first and second bottom surfaces of the recess region. For example, the portion of the dam structure conformally extends across the bond pads 150 disposed on the second bottom surface of the recess region. Alternatively, in the case where the bond pads 150 are spaced away from the side wall of the recess region (e.g., the inner sidewall of the second intermediate substrate layer 126), the dam structure is positioned between the bond pads 150 and the sidewall of the recess region.

In one embodiment, the dam structure 160 abuts sidewalls of the recess region below the lid-attach region. For example, the dam structure 160 contacts and extends along inner sidewalls of the first and second intermediate substrate layers 124 and 126. Other configurations for the dam structure may also be useful. For example, the dam structure 160 may also be positioned a distance away from the sidewalls of the recess region.

The dam structure 160 may include any suitable materials for forming a barrier structure against an encapsulation material. In one embodiment, the dam structure 160 includes a different dielectric material as the package substrate 120. For example, the dam structure may be formed from epoxy based dielectric material, such as epoxy resin. Alternatively, providing a dam structure 160 having a same dielectric material as the package substrate 120 may also be useful. For example, the dam structure may be formed from ceramic material. Other suitable materials, including metal material and organic material may also be used to form the dam structure.

The dam structure 160 includes a top surface positioned at a height above the semiconductor die 130 and wire bonds 135. The top surface of the dam structure 160 is a planar topmost surface having a substantially same height extending throughout the entire top surface of the dam structure 160. In one embodiment, the dam structure, for example, extends upwardly from the exposed top planar surface 122a of the bottom substrate layer 122, and the exposed top planar surface 124a of the first intermediate substrate layer 124, to a same height below the top planar surface 126a of the second intermediate substrate layer 126. For example, the top surface of the dam structure 160 is a step lower relative to the lid-attach region (exposed portion of the top planar surface 126a) of the package substrate 120. The reference numeral 190 denotes the height difference (or step height) between the top surface of the dam structure 160 and the lid-attach region, as shown particularly in FIG. 1c. Alternatively, the dam structure 160 may also be configured with a height dimension aligned to the height dimension of the lid-attach region. Other configurations of the dam structure 160 and lid-attach region may also be useful.

The semiconductor package 100 includes a package lid 170 attached to the lid-attach region corresponding to the exposed top planar surface 126a of the second intermediate substrate layer 126. The package lid 170 includes opposing top and bottom surfaces. The package lid 170 may be formed from any suitable materials including transparent material (e.g., glass) or opaque material (e.g., metal or ceramic). In one embodiment, the package lid 170 includes a centrally located aperture 175 extending vertically through the package lid 170, as shown particularly in FIGS. 1a and 1c. The aperture 175, for example, extends from the top surface of the package lid to the bottom surface of the package lid. The package lid may include a same thickness extending throughout. In one embodiment, the top and bottom surfaces of the package lid 170 include a non-planar topography. For example, the central region of the package lid 170 protrudes upwardly relative to the peripheral region of the package lid 170. The package lid 170, in combination with the recess region of the package substrate 120, defines a cavity 180 within which the semiconductor die 130 is enclosed, as shown particularly in FIG. 1c.

In one embodiment, the semiconductor die 130 may be a pressure sensor die 130 and the package lid 170 may be configured to accommodate the pressure sensor die 130 disposed in the cavity 180. For example, the aperture 175 may be a vent hole to facilitate communication between the pressure sensor die 130 and the environment outside of the semiconductor package 100 for pressure sensing. Although an oval-shaped aperture 175 is illustrated in FIG. 1a, it is understood that the aperture 175 may also be configured with other geometrical shapes such as, but not limited to, rectangular, square and circular shapes. A person of ordinary skill in the art would appreciate that the package lid 170 may be configured to accommodate other types of semiconductor die 130 without departing from the spirit of the invention described herein. For example, the package lid 170 may be a transparent package lid 170 devoid of any openings to accommodate an image sensor die 130.

The peripheral region of the package lid 170 may be attached to the lid-attach region using an adhesive layer 165. The adhesive layer 165, for example, bonds the bottom surface of the package lid 170 to the exposed top surface of the second intermediate substrate layer 126. The adhesive layer 165 may an adhesive paste or film having a polymer material, including epoxy resin paste, polyimide tape or the like. Other types of adhesive material, including solder material, may also be used to form the adhesive layer 165.

The semiconductor package 100 includes an encapsulant 185 disposed within the cavity 180 to completely encapsulate the semiconductor die 130 and wire bonds 135. For example, the encapsulant 185 contacts the bond pads 150 and the first and second bottom surfaces of the recess region, as shown particularly in FIG. 1c. In one embodiment, the encapsulant 185 is formed from an encapsulation material. The encapsulation material may be a mold compound such as, but not limited to, epoxy resin. Other suitable types of encapsulation material may also be useful. The encapsulant 185 serves to protect the semiconductor die 130 and wire bonds 135 mechanically and environmentally from the outside environment. For example, the encapsulant 185 protects the semiconductor die 130 from moisture. The encapsulant 185 fills the cavity 180 to a height above the semiconductor die 130 from the first bottom surface of the recess region to define a height of the encapsulant 185. In one embodiment, the encapsulant 185 partially fills the cavity 180 to a height below the top surface of the dam structure 160. The dam structure 160, for example, surrounds and extends above the top of the encapsulant 185, as shown particularly in FIGS. 1b and 1c.

The semiconductor package 100 described herein advantageously includes a dam structure 160, which functions as a reservoir (e.g., mold reservoir) within the cavity 180 to contain the encapsulant 185 and prevent the encapsulant from extending to the lid-attach region, as described in conjunction with FIGS. 5a-5e.

FIG. 2 shows a cross-sectional view of another embodiment of a semiconductor package 200 in accordance with the present disclosure. The semiconductor package 200 is similar to that described in FIGS. 1a-1c. For example, the semiconductor package 200 includes a cavity 180 within which a semiconductor die 130 is enclosed. Common elements and features having the same reference numerals may not be described or described in detail. In the interest of brevity, the description below primarily focuses on the difference(s) of the semiconductor package 200, as shown in FIG. 2, as compared with the semiconductor package 100 shown in FIGS. 1a-1c.

Referring to FIG. 2, a dam structure 260 is disposed within the cavity 180 in the recess region. The dam structure 260, for example, substantially surrounds the semiconductor die 130 and wire bonds 135. The dam structure 260 is disposed directly on the first and second bottom surfaces of the recess region. In one embodiment, the dam structure 260 abuts sidewalls of the recess region below the lid-attach region. For example, the dam structure 260 contacts and extends along inner sidewalls of the first and second intermediate substrate layers 124 and 126. Other configurations for the dam structure may also be useful. For example, the dam structure 260 may also be positioned away from sidewalls of the recess region. The dam structure 260 may include any suitable materials for forming a barrier structure against an encapsulation material. In one embodiment, the dam structure 260 includes a different dielectric material as the package substrate 120. For example, the dam structure may be formed from epoxy based dielectric material, such as epoxy resin. Alternatively, providing a dam structure having a same dielectric material as the package substrate 120 may also be useful. For example, the dam structure may be formed from ceramic material. Other materials, including metal material and organic material may also be used to form the dam structure.

The dam structure 260 includes a top surface positioned at a height above the semiconductor die 130 and wire bonds 135. The top surface of the dam structure 260 is a planar topmost surface having a substantially same height extending throughout the entire top surface of the dam structure 260. In one embodiment, the dam structure, for example, extends upwardly from the exposed top planar surface 122a of the bottom substrate layer 122, and the exposed top planar surface 124a of the first intermediate substrate layer 124, to a same height above the top planar surface 126a of the second intermediate substrate layer 126. For example, the top surface of the dam structure 260 is a step higher relative to the lid-attach region (exposed portion of the top planar surface 126a) of the package substrate 120. The reference numeral 290 denotes the height difference (or step height) between the top surface of the dam structure 260 and the lid-attach region. Other configurations of the dam structure 260 and the lid-attach region may also be useful.

Similar to the advantages described with respect to FIGS. 1a-1c, the dam structure 260 functions as a mold reservoir within the cavity 180 to contain the encapsulant 185. For example, the dam structure 260 prevents encapsulation material from encroaching onto the lid-attach region when conventional process parameters are employed to form the encapsulant 185, as described in conjunction with FIGS. 5a-5e.

Figure 3:
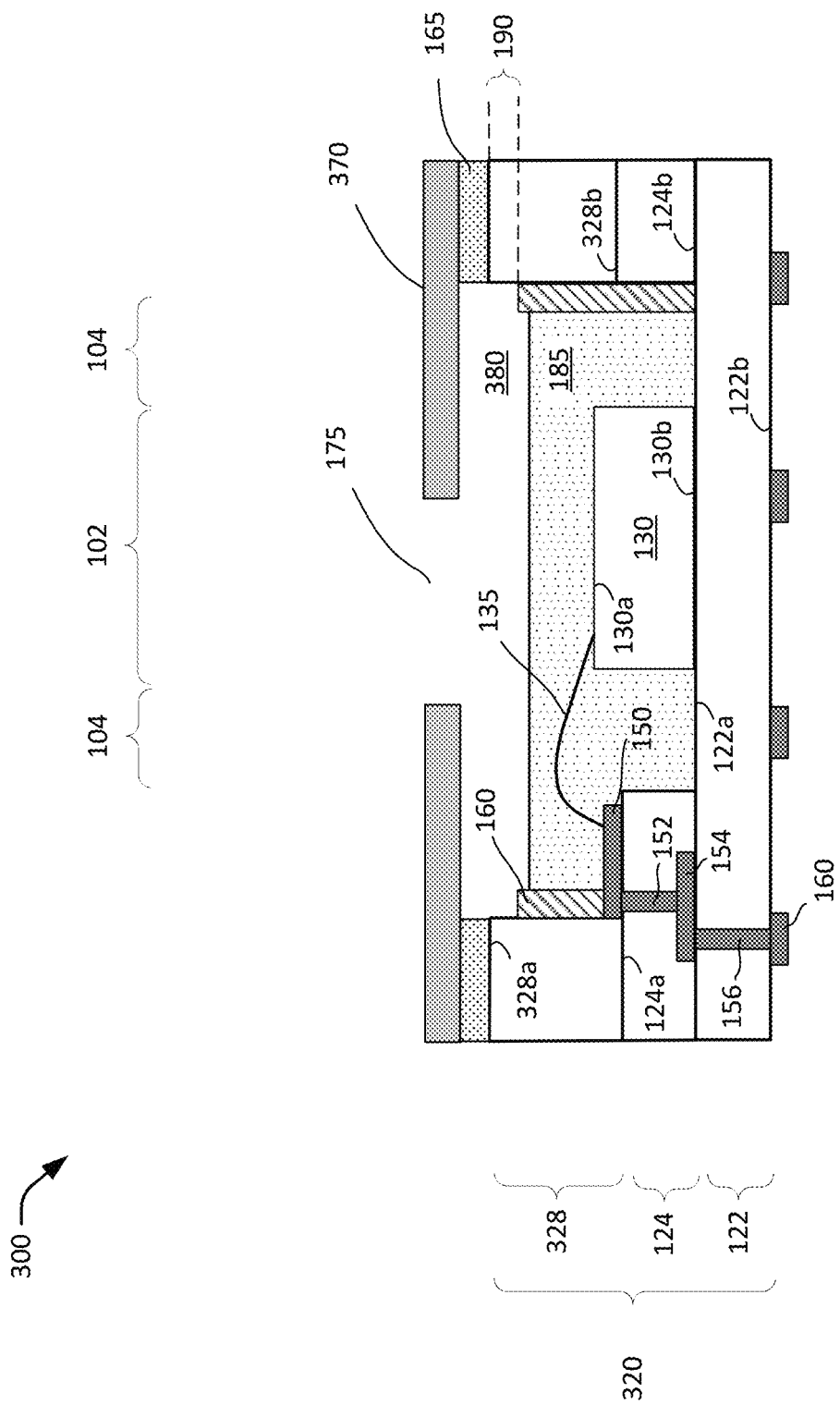
FIG. 3 shows a cross-sectional view of yet another embodiment of a semiconductor package.

FIG. 3 shows a cross-sectional view of yet another embodiment of a semiconductor package 300 in accordance with the present disclosure. The semiconductor package 300 is similar to that described in FIGS. 1a-1c. For example, the semiconductor package 300 includes a cavity 380 within which a semiconductor die 130 is enclosed. Common elements and features having the same reference numerals may not be described or described in detail. In the interest of brevity, the description below primarily focuses on the difference(s) of the semiconductor package 300, as shown in FIG. 3, as compared with the semiconductor package 100 shown in FIGS. 1a-1c.

Referring to FIG. 3, the semiconductor package 300 includes a package substrate 320. In one embodiment, the package substrate 320 may include a plurality of dielectric substrate layers that may be laminated or built-up. For example, the package substrate 320 includes a bottom substrate layer 122, an intermediate substrate layer 124 disposed on the bottom substrate layer 122, and a top substrate layer 328 disposed on the intermediate substrate layer 124. Other configurations of a multi-layer package substrate 320 may also be useful. In one embodiment, the package substrate 320 is a laminate-based multi-layer ceramic substrate. For example, the package substrate 320 includes an intermediate ceramic substrate layer 124 sandwiched between top and bottom ceramic substrate layers 328 and 122. Other types of dielectric substrate layer may also be used to form the package substrate 320. Each of the package substrate layers includes a first major surface (e.g., 122a, 124a, 328a) and a second major surface (e.g., 122b, 124b, 328b) opposite to the first major surface. The first major surface of the substrate layers may be referred to as the top planar surface and the second major surface of the substrate layers may be referred to as the bottom planar surface. Other designations for the first and second major surfaces may also be useful.

The semiconductor package 300 includes a package lid 370 attached to a lid-attach region defined on the top planar surface 328a of the top substrate layer 328. The package lid 370 includes opposing top and bottom surfaces. The package lid 370 may be formed from any suitable materials including transparent material (e.g., glass) or opaque material (e.g., metal or ceramic). In one embodiment, the package lid 370 includes a centrally located aperture 175 extending vertically through the package lid 370. The aperture 175, for example, extends from the top surface of the package lid to the bottom surface of the package lid. The package lid may include a same thickness extending throughout. In one embodiment, the entire top and bottom surfaces of the package lid 370 include a planar topography. For example, the package lid 370 may be configured with a flat shape. The package lid 370, in combination with the recess region of the package substrate 120, defines a cavity 380 within which the semiconductor die 130 is enclosed.

In comparison to the semiconductor package 100 shown in FIGS. 1a-1c, the semiconductor package 300 described with respect to FIG. 3a includes additional benefits. For example, semiconductor package 300 includes a package substrate 320 having fewer intermediate substrate layers, and a flat shape package lid 370 mounted onto the package substrate 320. As a result, the semiconductor package 300 advantageously includes a smaller cavity 380 and a reduced overall package thickness dimension relative to the semiconductor package 100 described in FIGS. 1a-1c.

Figure 4A:
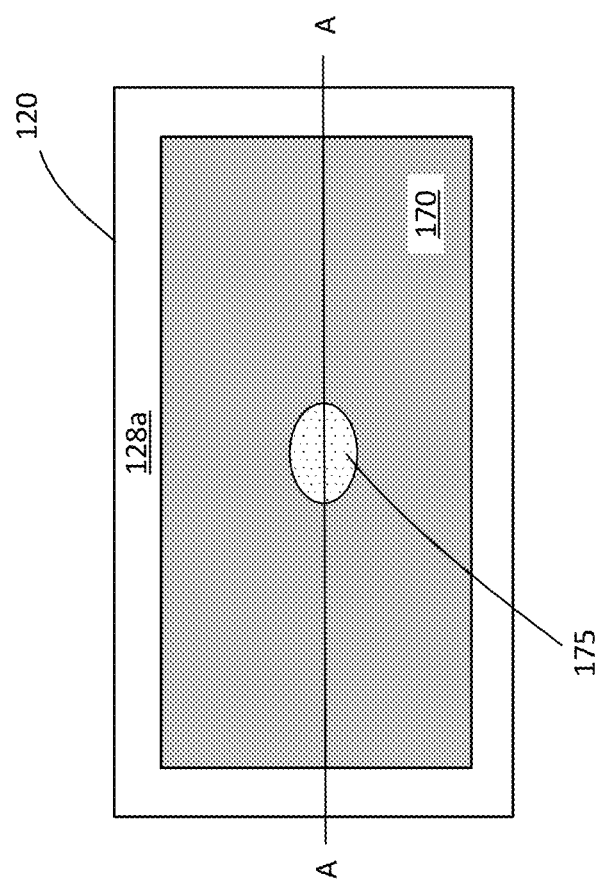
FIGS. 4a-4b show various top views of another embodiment of a semiconductor package.
Figure 4B:
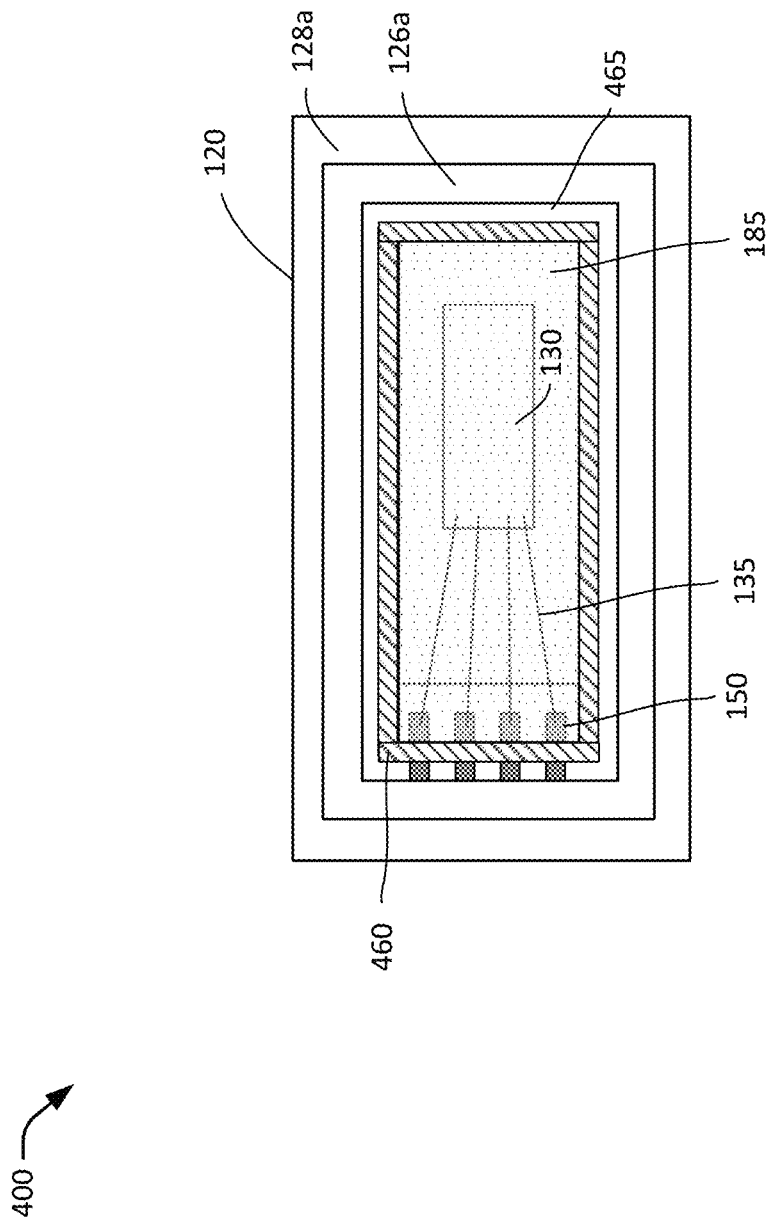
Figure 4C:
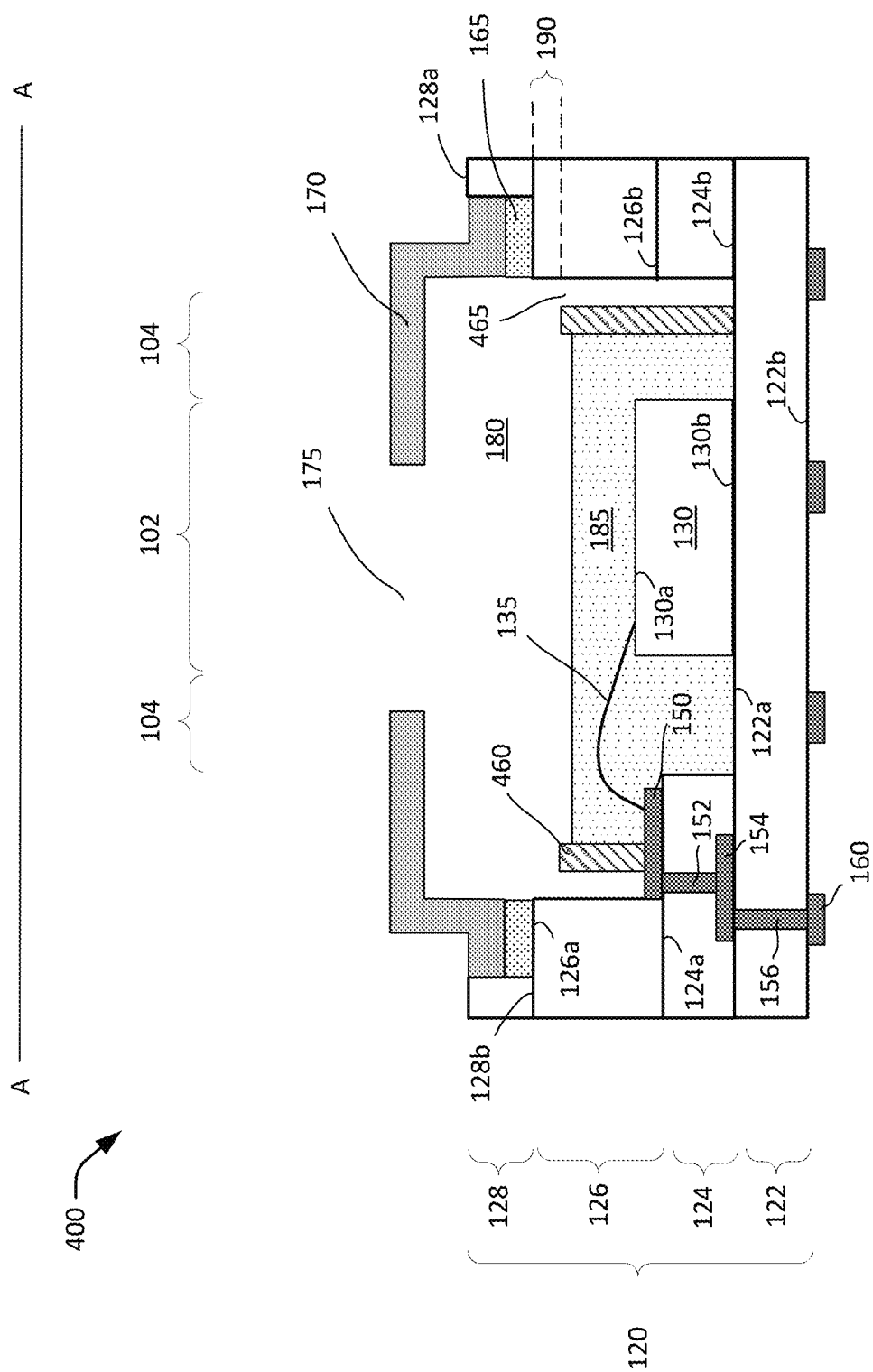
FIG. 4c shows a cross-sectional view of the semiconductor package of FIG. 4a taken along the A-A plane.

FIGS. 4a-4c shows various views of another embodiment of a semiconductor package 400 in accordance with the present invention. In particular, FIG. 4a shows a top view of a semiconductor package 400 having a package lid 170, FIG. 4b shows a simplified plan view of the semiconductor package 400 with the package lid 170 removed, and FIG. 4c shows a cross-sectional view of the semiconductor package 400 taken along the A-A plane. The semiconductor package 400 is similar to that described in FIGS. 1a-1c. For example, the semiconductor package 400 includes a cavity 180 within which a semiconductor die 130 is enclosed. Common elements and features having the same reference numerals may not be described or described in detail. In the interest of brevity, the description below primarily focuses on the difference(s) of the semiconductor package 400 shown in FIGS. 4a-4c, as compared with the semiconductor package 100 shown in FIGS. 1a-1c.

Referring to FIG. 4c, a dam structure 460 is disposed within the cavity 180 in the recess region. The dam structure 460, for example, substantially surrounds the semiconductor die 130 and wire bonds 135. The dam structure 460 is disposed directly on the first and second bottom surfaces of the recess region. In one embodiment, the dam structure 460 is positioned a distance away from sidewalls of the recess region below the lid-attach region, as shown particularly in FIGS. 4b and 4c. For example, a gap region 465 separates the dam structure 460 from the inner sidewalls of the first and second intermediate substrate layers 124 and 126. The gap region 465, for example, surrounds the entire dam structure 460. Other configurations for the dam structure may also be useful. In one embodiment, the bond pads 150 extend beyond a side of the dam structure 460 to a side wall of the recess region such that the gap region 465 overlaps and partially exposes the bond pads 150. Alternatively, in the case where the bond pads 150 are spaced away from the side wall of the recess region, the bond pads 150 may be disposed between the dam structure 460 and the semiconductor die 130 such that the gap region 465 does not overlap and expose the bond pads 150. The dam structure 260 may include any suitable materials. For example, the dam structure may be formed from same or different dielectric materials as the package substrate 120. Providing a dam structure formed from metal material or organic material may also be useful.

The dam structure 460 includes a top surface positioned at a height above the semiconductor die 130 and wire bonds 135. A height of the dam structure 460 is similar to that described with respect to the dam structure 160 described with respect to FIGS. 1a-1c. For example, the height of the top surface of the dam structure 460 is a step lower relative to the height of the lid-attach region of the package substrate 120. Other configurations of the dam structure 460 and the lid-attach region may also be useful.

Similar to the advantages described with respect to FIGS. 1a-1c, the dam structure 460 functions as a mold reservoir within the cavity 180 of the semiconductor package 400 to ensure that the encapsulant 185 does not encroach onto the lid-attach region during manufacturing processes to form the encapsulant 185.

FIGS. 5a-5e show cross-sectional views of an embodiment of a process 500 for forming a semiconductor package. The process 500 may be employed to form, for example, a semiconductor package same or similar as that described in FIGS. 1a-1c, 2 and 3. In the interest of brevity, common elements and features having the same reference numerals may not be described or described in detail.

Figure 5A:
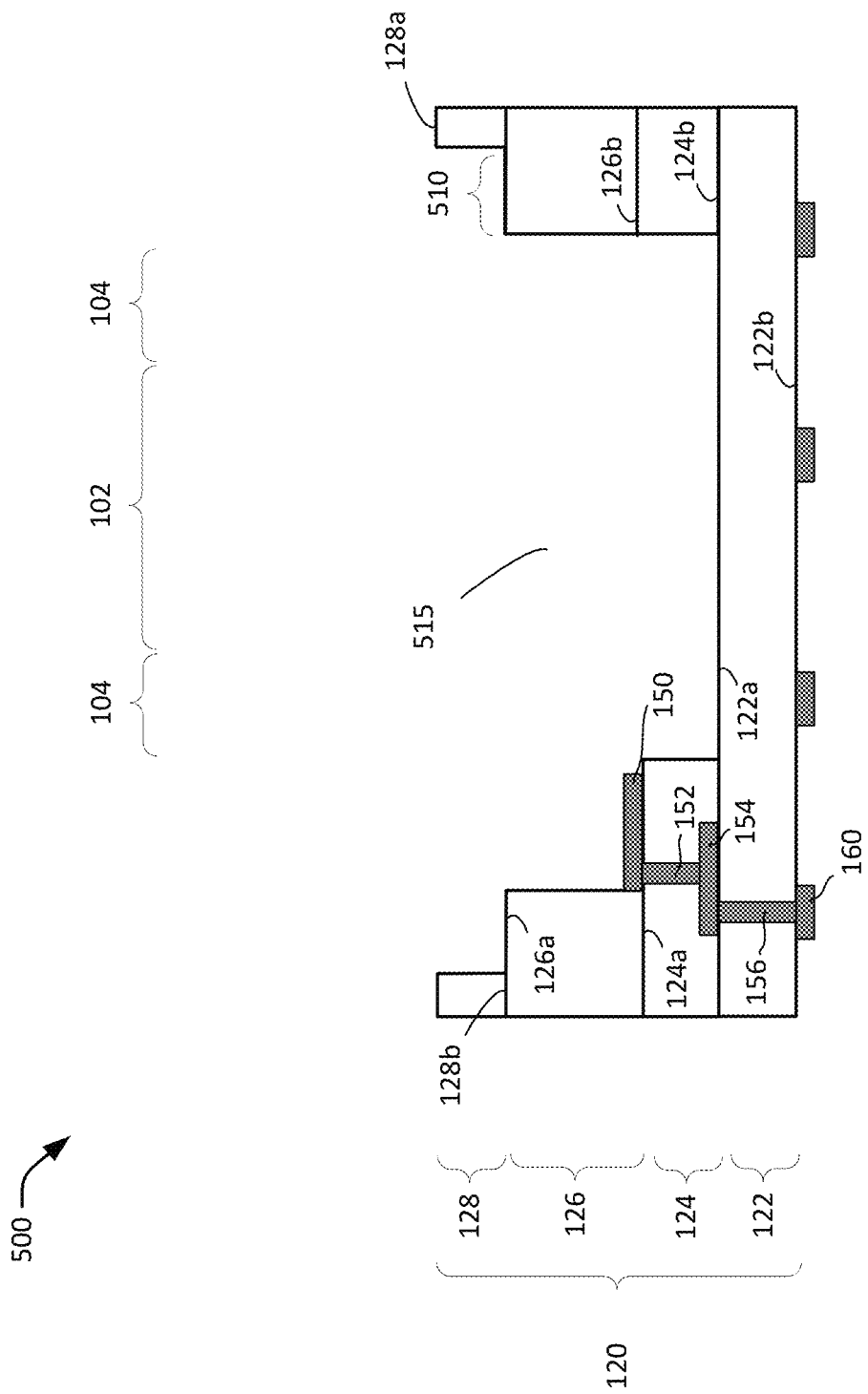
FIGS. 5a-5e show cross-sectional views of an embodiment of a process for forming a semiconductor package.

Referring to FIG. 5a, a package substrate 120 is provided. The package substrate 120 may be processed to include a plurality of dielectric substrate layers laminated to form a multi-layer package substrate embedded with interconnect structures. In one embodiment, ceramic fabrication processes are employed to form the multi-layer package substrate 120. For example, conventional fabrication processes are employed to form a multi-layered ceramic package substrate having a desired interconnect pattern corresponding to a plurality of interconnected line levels and via levels defined by the interconnect structures of the semiconductor package. Other suitable processes may also be employed to form the package substrate 120 and/or the interconnect structures. In an alternative embodiment, the interconnect structures may be formed by a printing process. The printing process may be an inkjet printing process as described in, for example, U.S. patent application Ser. No. 15/788,753, filed on Oct. 19, 2017, which is herein incorporated by reference in its entirety for all purposes.

The interconnect structures include, for example, bond pads 150, conductive traces 154, via contacts 152 and 156, and terminal pads 160. The conductive traces 154 and via contacts 152 and 156 provide an electrical connection from the bond pads 150 to the terminal pads 160. The interconnect structures may be formed from any suitable conductive material, including Cu, A, Au, Ag, Ni, solder material, or the alloys of these materials, or a combination thereof. Other types of conductive material may also be employed.

The package substrate 120 includes at least one active device region corresponding to a region for processing a semiconductor package. In one embodiment, openings of various sizes are formed in the substrate layers within the active device region to form a recess region 515 in the substrate 120. For example, a first rectangular opening is formed in the first intermediate substrate layer 124, a second rectangular opening is formed in the second intermediate substrate layer 126 and a third rectangular opening is formed in the top substrate layer 128. The various rectangular openings may be formed by mask and etch techniques. Other techniques may also be employed to form the rectangular openings.

The first rectangular opening formed in the first intermediate substrate layer 124 partially exposes the top planar surface 122a of the bottom substrate layer 122 and includes a sufficient size to accommodate a semiconductor die disposed therein. For example, the exposed portion of the top planar surface 122a of the bottom substrate layer 122 is a sufficient size to accommodate a die region 102 and a non-die region 104 surrounding the die attach region.

The second rectangular opening formed in the second intermediate substrate layer 126 completely exposes the first rectangular opening and partially exposes the top planar surface 124a of the first intermediate substrate layer 124. The exposed portion of the top planar surface 124a corresponds to the location where bond pads 150 and a dam structure are to be formed on the first intermediate substrate layer 124.

The third rectangular opening formed in the top substrate layer 128 completely exposes the second rectangular opening and partially exposes the top planar surface 126a of the second intermediate substrate layer 126. The exposed portion of the top planar surface 126a corresponds to the location where the lid-attach region 510 is defined on the second intermediate substrate layer 126. The first, second and third rectangular openings are superimposed to form a recess region 515 of the package substrate 120. Sidewalls of the recess region 515 are, for example, defined by inner sidewalls of the different substrate layers. Exposed portions of the top planar surfaces 122a and 124a define first and second bottom surfaces of the recess region 515 respectively.

Although one active device region is illustrated, it is to be understood that the package substrate 120 may be configured with two or more active device regions separated by inactive device regions for the assembly of a plurality of semiconductor packages. For example, the package substrate 120 may be configured with a plurality of active device regions arranged in a matrix format.

Figure 5B:
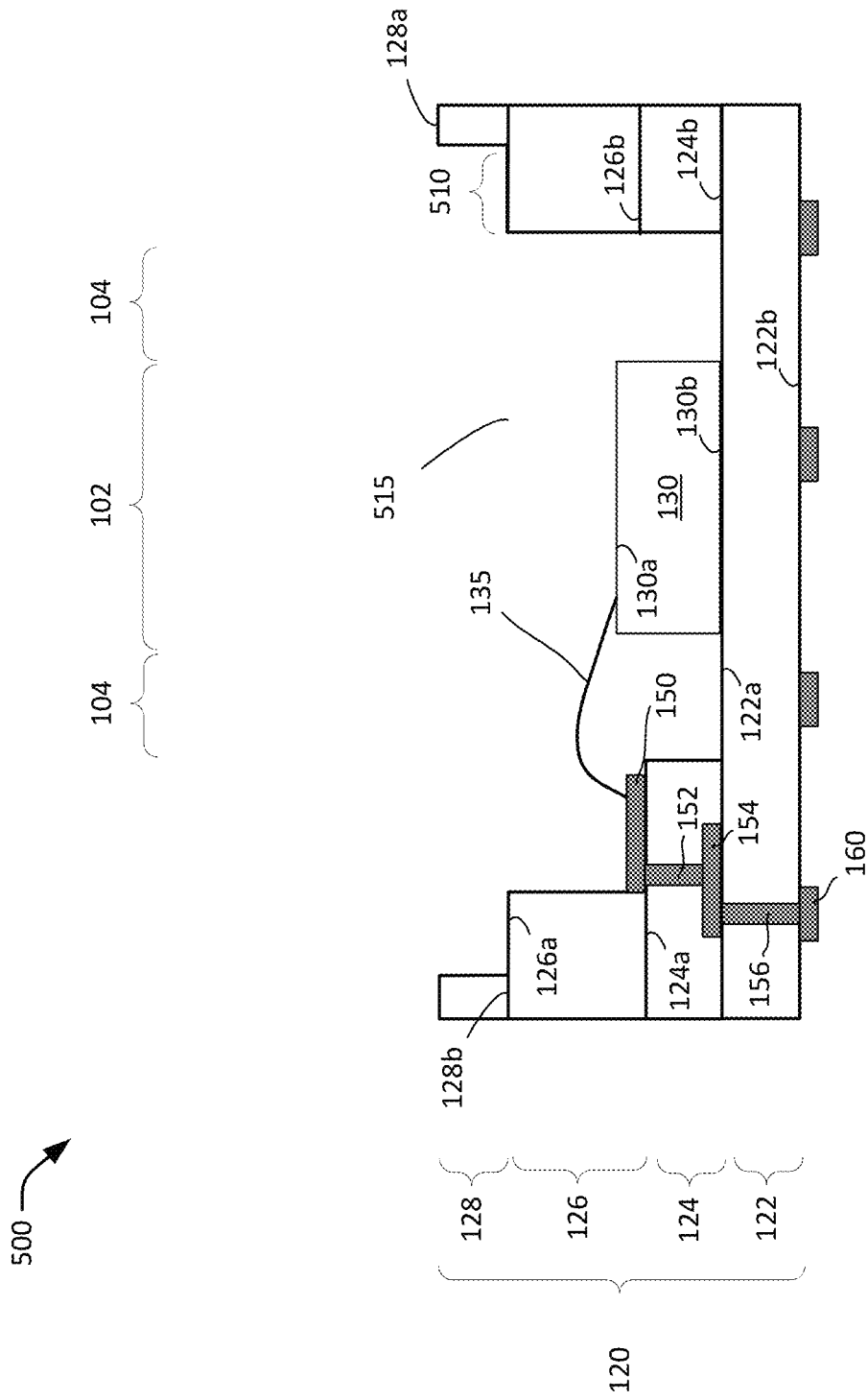

Referring to FIG. 5b, a semiconductor die 130 is mounted onto the exposed top planar surface 122a of the bottom substrate layer 122 within the die region 102. The semiconductor die 130 includes a top surface 130a and a bottom surface 130b. The top surface 130a of the semiconductor die 130 includes openings in a final passivation layer to expose conductive die pads (not shown). The die pads serve as contact terminals for electrical connections to the internal circuitry of the semiconductor die 130. The die pads are, for example, formed of a conductive material, such as Cu, Al, Au, Ag, Ni, solder material, or the alloys of these materials, or a combination thereof. Other types of conductive material may also be useful. The die pads may be arranged into one or more rows disposed along the periphery of the top surface 130a of the semiconductor die 130. Other arrangements of die pads may also be useful.

In one embodiment, the bottom surface 130b of the semiconductor die 130 is attached to the top planar surface 122a of the bottom substrate 122 using a die attach layer (not shown). The die attach layer, for example, covers the entire bottom surface 130b of the semiconductor die 130. The die attach layer may include an adhesive material to bind and fix the semiconductor die 130 in position within the recess region 515. For example, the die attach layer may be a polymer material, including epoxy resin paste, polyimide tape, or the like. Other suitable types of adhesive material may also be employed.

In one embodiment, a plurality of wire bonds 135 are formed to electrically connect the semiconductor die 130 to the interconnect structures of the package substrate 120. For example, a first end of the wire bonds 135 are bonded to the die pads of the semiconductor die 130 and a second end of the wire bonds 135 are bonded to the bond pads 150 formed on the exposed portion of the top surface 124a of the first intermediate layer 124. Each wire bond, for example, corresponds to a metal wire. The wire bonds may be formed from Au, Cu, Ag, Al, Ni or any alloy thereof. Other types of conductive material may also be used to form the wire bonds.

Figure 5C:
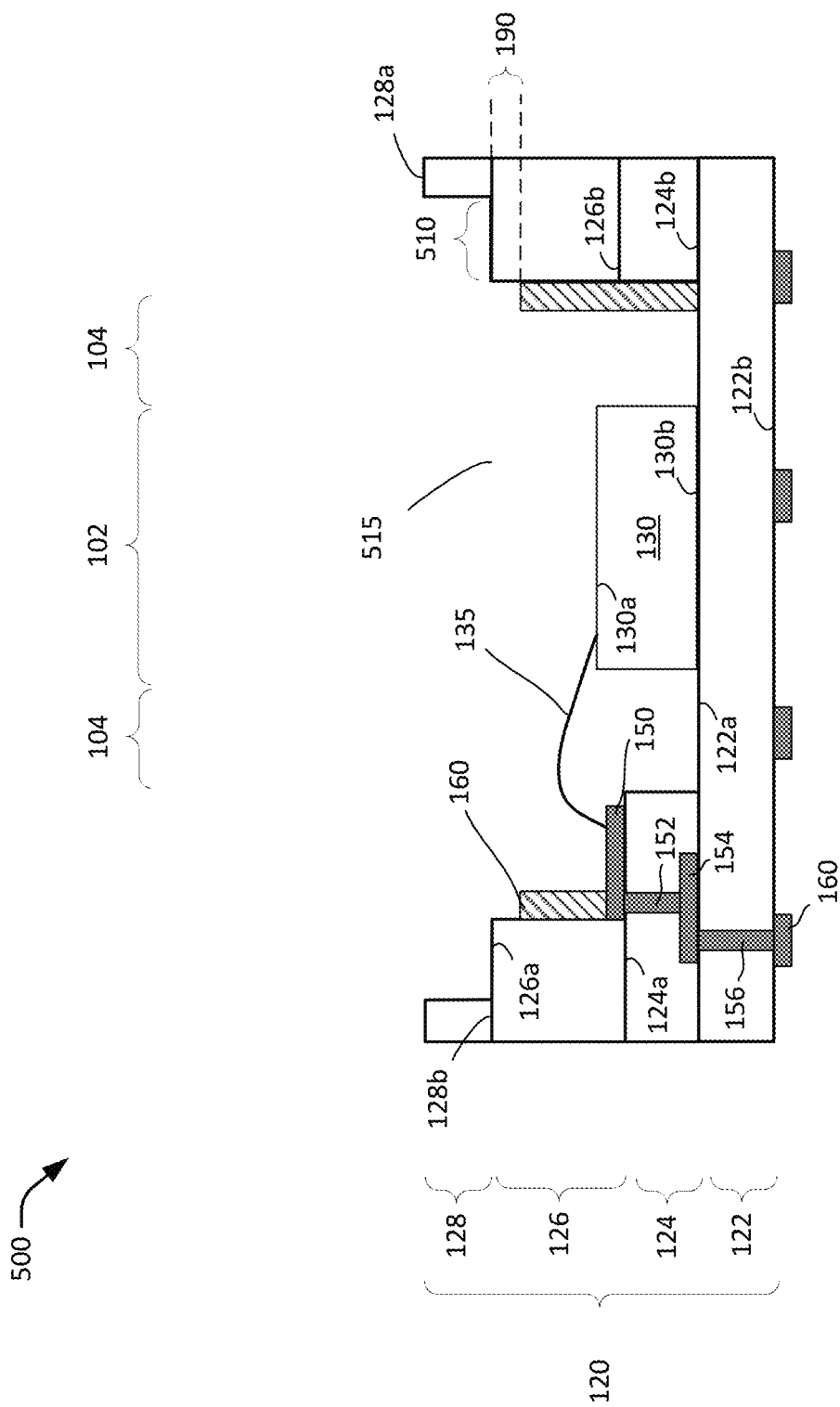

Referring to FIG. 5c, a dam structure 160 is formed within the recess region 515 of the package substrate 120. In one embodiment, the dam structure 160 is a dielectric structure formed from any suitable techniques, including dispensing, jetting and bonding techniques. For example, dielectric material is dispensed into the recess region 515 to form the dam structure 160 at a predetermined position. In one embodiment, the dam structure 160 includes an epoxy based dielectric material. For example, suitable process parameters are employed to dispense epoxy resin into the recess region 515 to form the dam structure 160 having a desired height and thickness. In one embodiment, the dam structure 160 is formed to a height below the lid-attach region 510. For example, the top surface of the dam structure 160 is a step lower relative to the lid-attach region 510. Other dielectric materials may also be used to form the dam structure 160.

In an alternative embodiment, the dam structure 160 includes a ceramic material same as the package substrate 120. In such case, the dam structure 160 may be formed integrally and concurrently with the corresponding substrate layers 124, 126 and 128. For example, the dam structure may be a ceramic structure having a top surface that is in alignment with the lid-attach region (or top surface 126a of the second intermediate substrate layer). Other materials, including metal material and organic material may also be used to form the dam structure 160.

In one embodiment, the dam structure 160 abuts sidewalls of the recess region below the lid-attach region. For example, the dam structure 160 contacts and extends along inner sidewalls of the first and second intermediate substrate layers 124 and 126. Positioning the dam structure away from sidewalls of the recess region may also be useful. The dam structure 160 defines a reservoir (e.g., mold reservoir) within the cavity 180.

Although FIG. 5c illustrates a process for forming an epoxy based dielectric dam structure 160 having a top surface positioned below the lid-attach region 510, it is to be appreciated that the dam structure 160 may be configured to extend upwardly above the lid-attach region 510, as described particularly in FIG. 2. For example, the height of the top surface of the dam structure 160 may be a step higher relative to the lid-attach region 510.

Figure 5D:
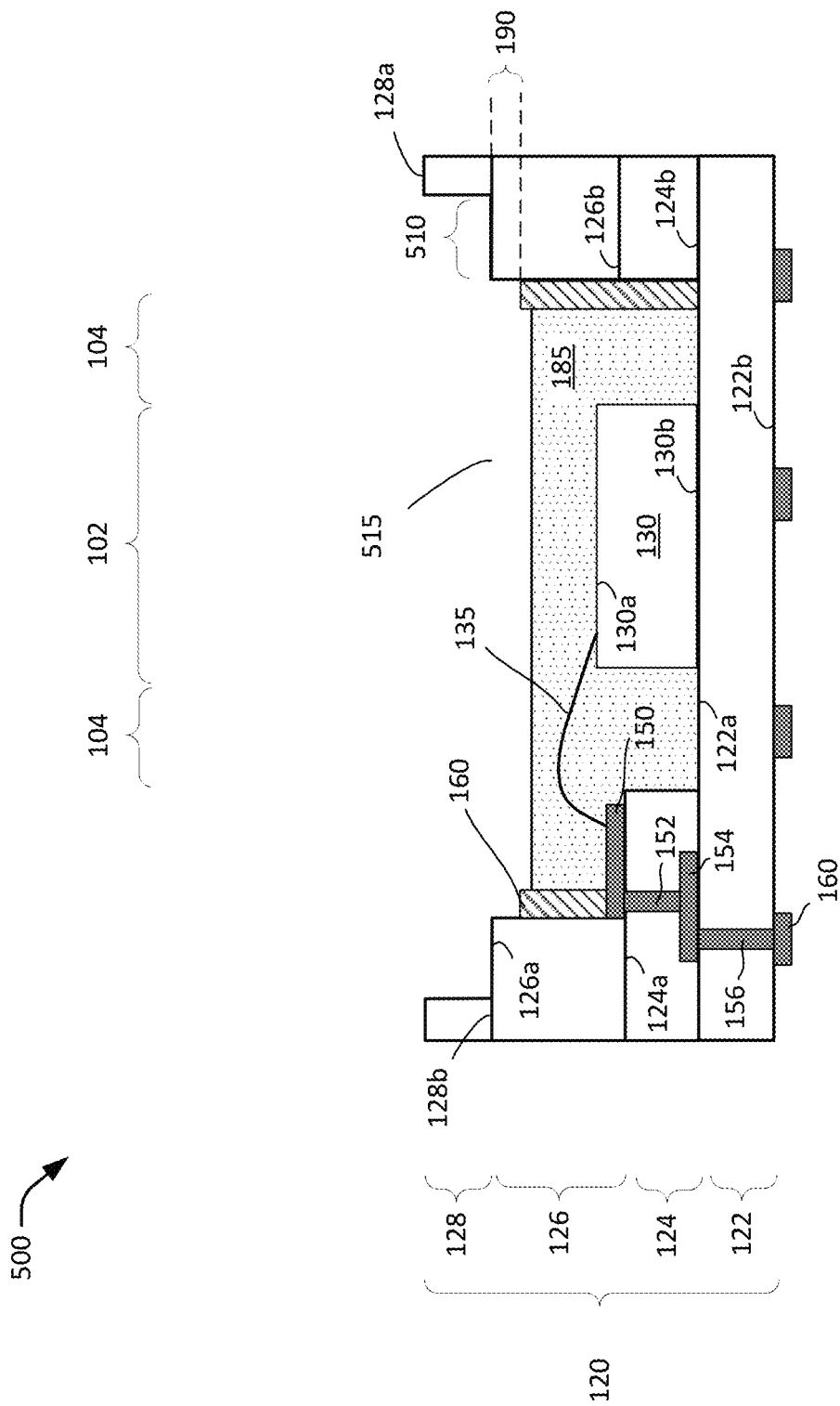

Referring to FIG. 5d, an encapsulant 185 is formed within the recess region 515. The top surface of the encapsulant 185 extends above the wire bonds 135 and semiconductor die 130. For example, the encapsulant 185 surrounds the semiconductor die 130 and wire bonds 135. In one embodiment, the encapsulant 185 is configured to encapsulate exposed portions of the bond pads 150. For example, the encapsulant 185 contacts and covers exposed portions of the bond pads 150 between the dam structure 160 and the semiconductor die 130. The encapsulant 185 provides a rigid and mechanically strong structure to protect the semiconductor die 130 from mechanical stresses and moisture in the environment.

In one embodiment, the encapsulant 185 is formed by dispensing liquid encapsulant into the recess region 515 to partially fill the reservoir defined by the dam structure 160. The liquid encapsulant, for example, extends to a height above the semiconductor die 130 and wire bonds 135. The process parameters for dispensing the liquid encapsulant may be configured such that liquid encapsulant fills the recess region 515 to a height below the top surface of the dam structure 160. For example, the height of the top surface of the dam structure 160 provides a dispensing endpoint for dispensing liquid encapsulant to a predetermined height. In one embodiment, the liquid encapsulant includes a low viscosity mold compound. For example, the liquid encapsulant includes epoxy resin in liquid form. Other types of liquefied molding compound such as ceramic, plastic, or a combination thereof, may also be used to form the encapsulant 185. After the liquid encapsulant is dispensed into the recess region 515, a curing process is performed to increase the viscosity of the liquid encapsulant and form the structurally rigid encapsulant 185.

Figure 5E:
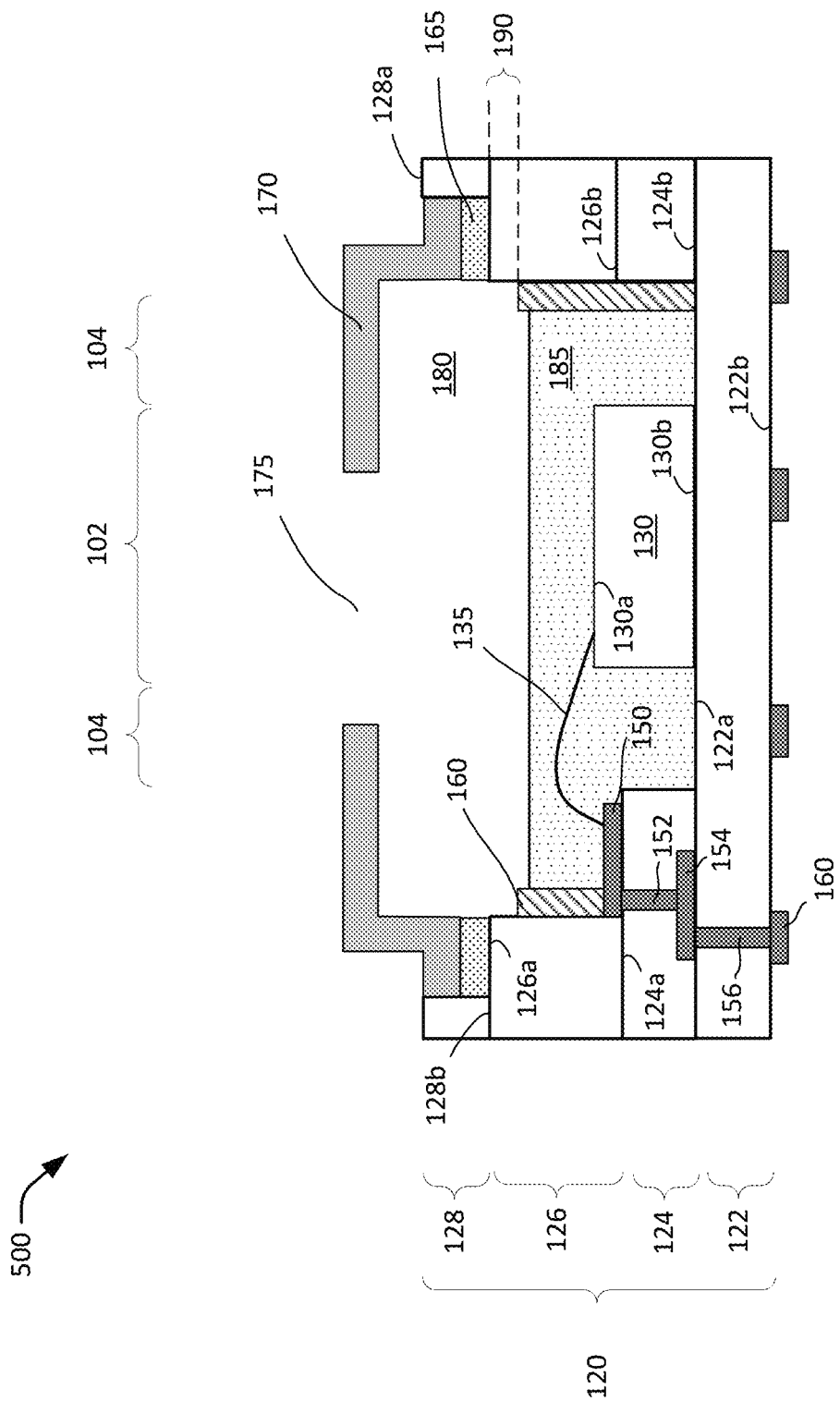

Referring to FIG. 5e, a package lid 170 is mounted onto the package substrate 120. The package lid 170 is, for example, attached to the lid-attach region 510 defined on the package substrate 120. The package lid 170 may be formed from any suitable materials including transparent material (e.g., glass) or opaque material (e.g., metal or ceramic). The package lid 170, in combination with the recess region 515 of the package substrate 120, defines a cavity 180 within which the semiconductor die 130 and encapsulant 185 is enclosed.

An adhesive layer 165 may be formed to bond and fix a peripheral region of the package lid 170 to the exposed portion of the top surface 126a of the second intermediate substrate layer 126 corresponding to the lid-attach region 510. In one embodiment, the adhesive layer 165 is formed by dispensing an adhesive material onto the lid-attach region 510. The adhesive layer 165 may be an adhesive paste or film having a polymer material, including epoxy resin paste, polyimide tape, or the like. Other types of adhesive material may also be useful.

It is to be appreciated that attaching the package lid 170 to a lid-attach region 510 disposed in the recess region 515 advantageously allows sidewalls of the recess region 515 (corresponding to inner sidewalls of the top substrate layer 128) to mechanically restrict the package lid 170 from any undesirable lateral movements during the process of mounting the package lid 170 to the lid-attach region.

In one embodiment, the process continues by performing a package singulation process. The singulation process, for example, mechanically separates the active device regions of the package substrate 120 from one another to form individual semiconductor packages 100, such as that described in FIGS. 1a-1c.

Conventional methods for encapsulating a semiconductor die housed within a recess of a semiconductor package substrate generally utilize the height of the lid-attach region for endpoint monitoring, which often result in liquefied encapsulant material encroaching onto the lid-attach region of the package substrate. The presence of encapsulant material on the lid-attach region undesirably results in poor adhesion of the package lid to the lid-attach region of the package substrate. Existing solutions to circumvent manufacturing defects associated with encroachment of liquefied encapsulant material onto the lid-attach region include forming multiple layers of adhesive material onto the lid-attach region. For example, a first adhesive layer may be formed on the lid-attach region prior to encapsulating the semiconductor die and a second adhesive layer may be formed on the first adhesive layer after the semiconductor die is encapsulated.

In comparison, the present invention improves the process window for encapsulating the semiconductor die 130 by providing a dam structure 160 within the recess region 515. The dam structure 160 functions as a reservoir within the recess region 515 to contain and prevent liquefied encapsulant material from encroaching onto the lid-attach region 510 during the process of encapsulating the semiconductor die 130. For example, the dam structure 160 is configured with a top surface positioned below the lid-attach region 510 to improve endpoint control for dispensing liquid encapsulant into the recess region 515. Alternatively, the dam structure may be configured with a top surface positioned above the lid-attach region 510, as described in FIG. 2. Providing a dam structure that extends to a height above the lid-attach region 510 prevents liquefied encapsulant material from encroaching onto the lid-attach region 510 when conventional process parameters are employed to dispense liquid encapsulant into the recess region 515. In addition, the present invention allows the adhesive layer 165 to be reliably formed in a single process step, thereby improving throughput and reducing manufacturing costs. Accordingly, the present invention provides a semiconductor package with improved reliability and yield.

Figure 6A:
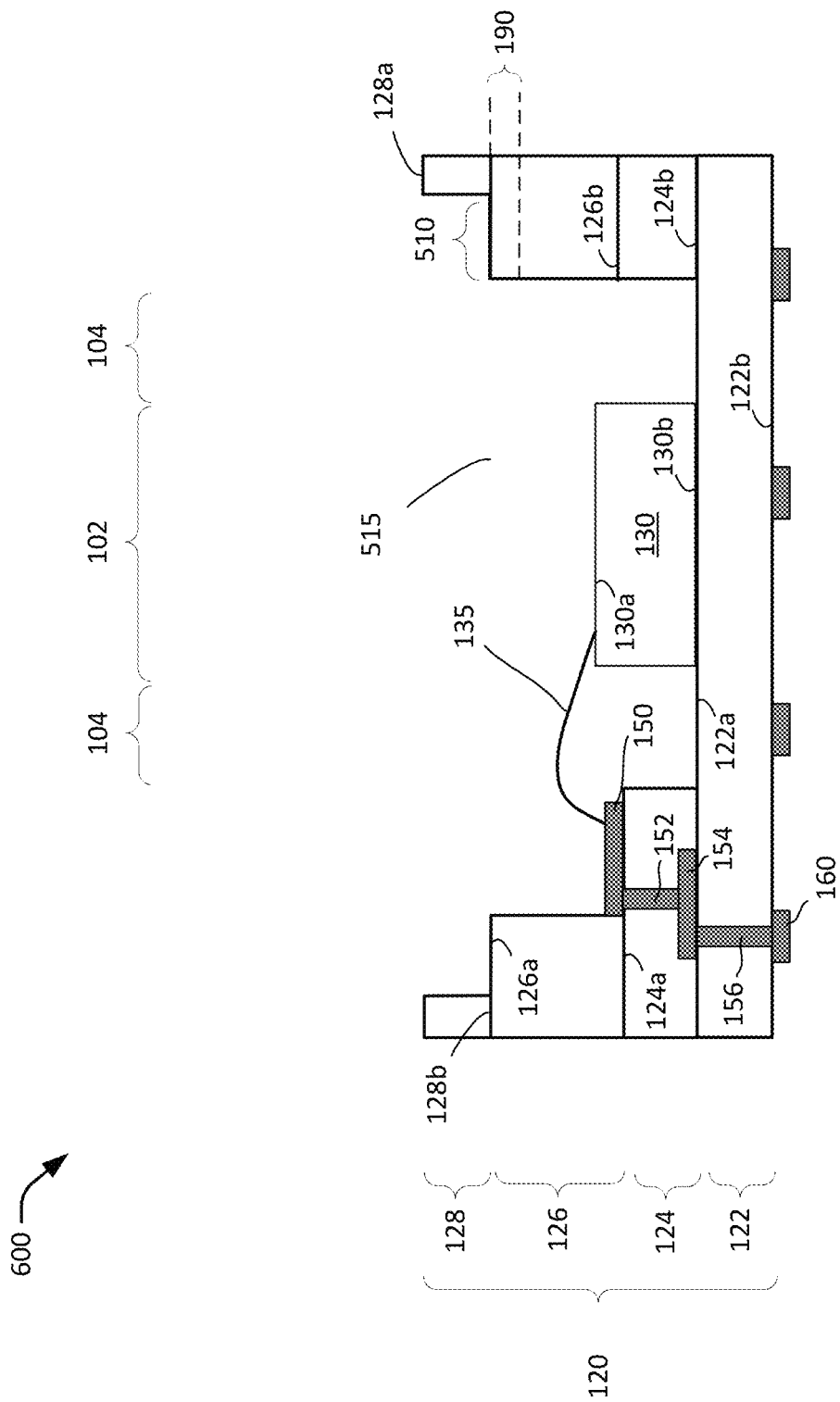
FIGS. 6a-6c show cross-sectional views of another embodiment of a process for forming a semiconductor package.
Figure 6B:
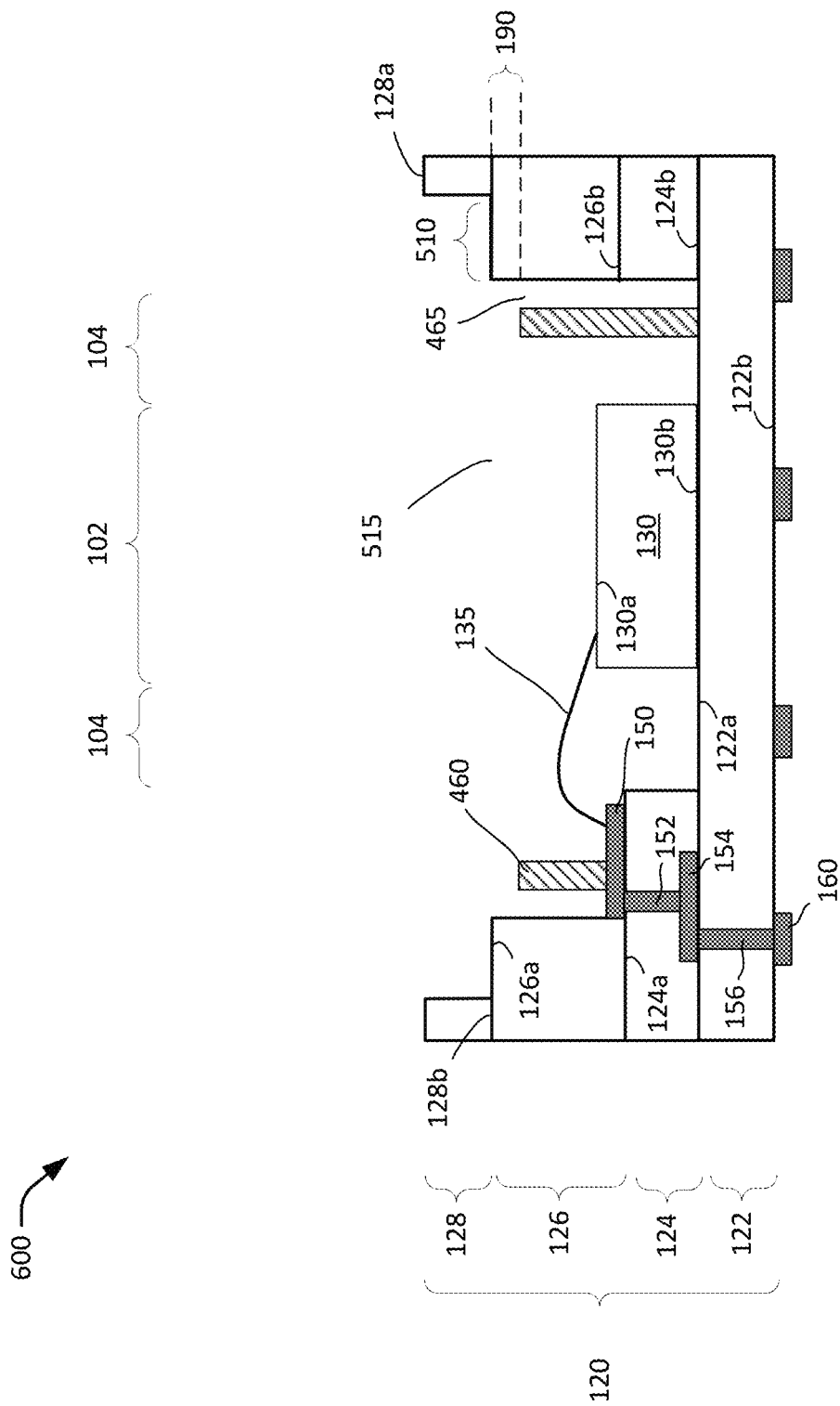
Figure 6C:
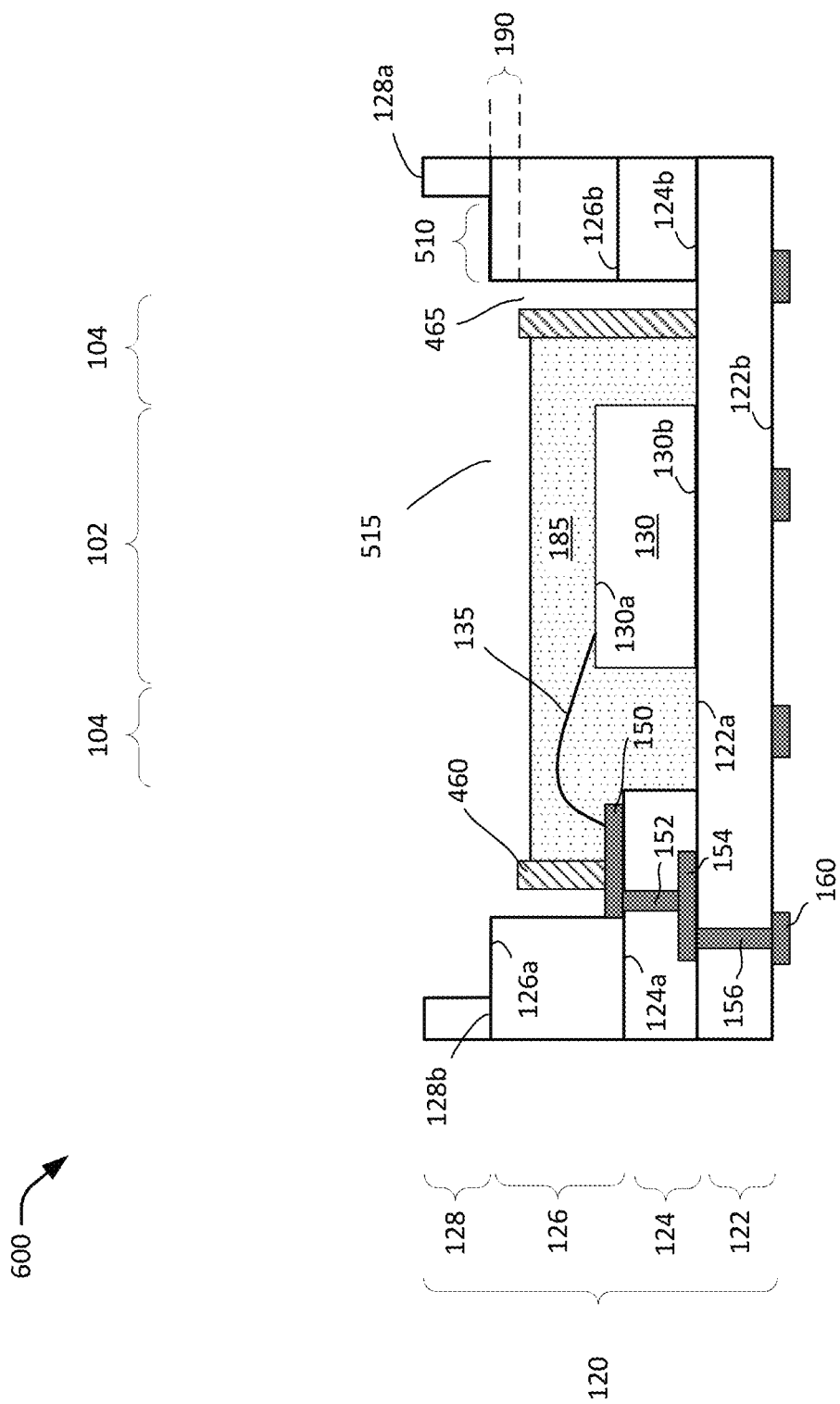

FIGS. 6a-6c show cross-sectional views of another embodiment of a process 600 for forming a semiconductor package. The process may be employed to form, for example, a semiconductor package same or similar as that described in FIGS. 4a-4c. The process 600 includes similar process steps as that described in FIGS. 5a-5e. In the interest of brevity, common elements, common process steps and features having the same reference numerals may not be described or described in detail.

Referring to FIG. 6a, a package substrate 120 is provided. The package substrate 120 may be partially processed to form same or similar features described in FIGS. 5a-5b. For example, the partially processed semiconductor package is at the same stage as that described in FIG. 5b.

Referring to FIG. 6b, the process 600 continues by forming a dam structure 460 within the recess region 515. In one embodiment, the dam structure 460 includes a dielectric material. For example, the dam structure 460 may be an epoxy based dielectric structure or a ceramic structure. Other types of materials may also be used to form the dam structure 460. The dam structure 460 may be formed from any suitable techniques, as described with respect to FIG. 5c.

In one embodiment, the dam structure 460 is formed to a height below the lid-attach region 510. For example, the top surface of the dam structure 160 is a step lower relative to the lid-attach region 510. In one embodiment, the dam structure 460 is positioned a distance away from sidewalls of the recess region 515 below the lid-attach region 510. For example, a gap region 465 separates the dam structure 460 from the inner sidewalls of the first and second intermediate substrate layers 124 and 126. Other configurations for the dam structure may also be useful. The dam structure 460 defines a reservoir surrounded by a gap region 465 within the cavity 180.

Referring to FIG. 6c, an encapsulant 185 is formed within the reservoir in the recess region 515. The top surface of the encapsulant 185 surrounds and extends above the wire bonds 135 and semiconductor die 130. In one embodiment, the encapsulant 185 is configured to encapsulate exposed portions of the bond pads 150. For example, the encapsulant 185 contacts and covers portions of the bond pads 150 exposed between the dam structure 460 and the semiconductor die 130. In one embodiment, the encapsulant 185 is formed by dispensing liquid encapsulant into the recess region 515 to partially fill the reservoir defined by the dam structure 460. The process parameters for dispensing the liquid encapsulant may be configured such that liquid encapsulant fills the recess region 515 to a height below the top surface of the dam structure 460. For example, the height of the top surface of the dam structure 460 provides an endpoint reference for controlled dispensing of liquid encapsulant. After the liquid encapsulant is dispensed into the reservoir, a curing process is performed to increase the viscosity of the liquid encapsulant and form the structurally rigid encapsulant 185.

In one embodiment, the process 600 continues as described with respect to FIG. 5e. For example, the process 600 continues by attaching a package lid 170 to the lid-attach region 510 to define a cavity 180 within which the semiconductor die 130 and encapsulant 185 is enclosed. Thereafter, a package singulation process mechanically separates the active device regions of the package substrate 120 from one another to form individual semiconductor packages 400, such as that described in FIGS. 4a-4c.

In comparison to the process 500 described with respect to FIGS. 5a-5e, the process 600 described in FIGS. 6a-6c further improves the process window for encapsulating the semiconductor die 130 by surrounding the dam structure 460 with a gap region 465. For example, the dam structure 460 functions as a primary mold reservoir within the recess region 515 to contain liquefied encapsulant material dispensed into the recess region 515, while the gap region 465 functions as a secondary mold reservoir to contain any excess liquefied encapsulant material that may overflow from the primary mold reservoir. Accordingly, the endpoint control for dispensing liquid encapsulant material into the recess region 515 may be less stringent.

The inventive concept of the present disclosure may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A method of forming a semiconductor package comprising:
    forming a multi-layer package substrate having a first major surface and a second major surface opposite to the first major surface, wherein the package substrate comprises a recess region extending downwardly from the first major surface of the package substrate, wherein the recess region is defined with a die region and a non-die region surrounding the die region;
    providing a semiconductor die, wherein the semiconductor die is disposed in the die region within the recess region;
    forming wire bonds, wherein the wire bonds electrically connect the semiconductor die to input/output (I/O) terminals disposed adjacent the second major surface of the package substrate;
    forming a dam structure within the recess region, wherein the dam structure surrounds the semiconductor die and extends upwardly to a height below the first major surface of the package substrate;
    dispensing a liquid encapsulant material into the recess region, wherein the liquid encapsulant material is surrounded by the dam structure, wherein the liquid encapsulant extends upwardly to a height below the height of the dam structure; and
    attaching a package lid to the package substrate.

2. The method of claim 1 wherein the package lid encloses the recess region.

3. The method of claim 1 wherein attaching the package lid to the package substrate comprises forming an adhesive layer directly on a lid-attach region defined on the package substrate, wherein the adhesive layer is formed after dispensing the liquid encapsulant material into the recess region.

4. The method of claim 3 wherein the lid-attach region is positioned at a height above a top surface of the dam structure.

5. The method of claim 3 wherein the lid-attach region is positioned at a height below a top surface of the dam structure.

6. The method of claim 3 wherein the package lid is attached to the first major surface of the package substrate.

7. The method of claim 3 wherein the package substrate comprises an intermediate substrate layer disposed between top and bottom substrate layers, wherein a top surface of the intermediate substrate layer is exposed by the recess region and defines the lid-attach region.

8. The method of claim 1 comprising performing a curing process on the liquid encapsulant material to form a structurally rigid encapsulant which encapsulates the semiconductor die and the wire bonds.

9. The method of claim 1 wherein the dam structure comprises an epoxy based dielectric material and the package substrate comprises a ceramic material.

10. The method of claim 1 wherein the dam structure and the package substrate comprise a same ceramic material.

11. The method of claim 1 wherein the dam structure abuts sidewalls of the recess region.

12. The method of claim 1 wherein the dam structure is positioned away from sidewalls of the recess region to form a gap region surrounding the dam structure in the recess region.

13. A method of forming a semiconductor package comprising:
    forming a package substrate having a first major surface and a second major surface opposite to the first major surface, wherein the package substrate comprises a recess region extending downwardly from the first major surface of the substrate, wherein the recess region is defined with a die region and a non-die region surrounding the die region;

providing a semiconductor die, wherein the semiconductor die is disposed in the die region within the recess region;

forming a dam structure within the recess region, wherein the dam structure surrounds the semiconductor die and extends upwardly to a height below the first major surface of the package substrate;

dispensing a liquid encapsulant material into the recess region, wherein the liquid encapsulant material is surrounded by the dam structure, wherein the liquid encapsulant extends upwardly to a height below the height of the dam structure; and attaching a package lid to the package substrate, wherein the package lid encloses the recess region.

14. The method of claim 13 wherein the package substrate comprises ceramic material.

15. The method of claim 14 comprising forming wire bonds, wherein the wire bonds electrically connect the semiconductor die to input/output (I/O) terminals disposed adjacent the second major surface of the package substrate.

16. The method of claim 14 wherein attaching the package lid to the package substrate comprises forming an adhesive layer directly on a lid-attach region defined on the package substrate, wherein the adhesive layer is formed after dispensing the liquid encapsulant material into the recess region.

17. The method of claim 16 wherein the dam structure is positioned away from sidewalls of the recess region to form a gap region surrounding the dam structure in the recess region.

18. A method of forming a semiconductor package comprising:

forming a package substrate having a first major surface and a second major surface opposite to the first major surface, wherein the package substrate comprises a recess region below the first major surface defined with a die region and a non-die region surrounding the die region;

providing a semiconductor die, wherein the semiconductor die is disposed in the die region within the recess region;

forming a dam structure within the recess region, wherein the dam structure surrounds the semiconductor die and extends upwardly to a height below the first major surface of the package substrate;

dispensing a liquid encapsulant material into the recess region, wherein the liquid encapsulant material is surrounded by the dam structure, wherein the liquid encapsulant extends upwardly to a height below the height of the dam structure; and attaching a package lid to the package substrate.

19. The method of claim 18 wherein the package lid encloses the recess region.

20. The method of claim 18 comprising a gap region surrounding the dam structure in the recess region, wherein the gap region separates the dam structure from sidewalls of the recess region.

* * * * *